United States Patent
Yamashita et al.

(10) Patent No.: US 10,961,903 B2
(45) Date of Patent: Mar. 30, 2021

(54) SUPERCHARGING SYSTEM, CONTROL DEVICE FOR SUPERCHARGING SYSTEM, AND METHOD FOR OPERATING SUPERCHARGING SYSTEM

(71) Applicant: MITSUBISHI HEAVY INDUSTRIES, LTD., Tokyo (JP)

(72) Inventors: Yukio Yamashita, Tokyo (JP); Hiroyoshi Kubo, Tokyo (JP); Mitsufumi Goto, Tokyo (JP); Musashi Sakamoto, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 16/428,503

(22) Filed: May 31, 2019

(65) Prior Publication Data
US 2019/0284991 A1  Sep. 19, 2019

Related U.S. Application Data

(62) Division of application No. 15/532,601, filed as application No. PCT/JP2015/052659 on Jan. 30, 2015, now abandoned.

(51) Int. Cl.
*F02B 37/24* (2006.01)
*F02B 39/10* (2006.01)
(Continued)

(52) U.S. Cl.
CPC ............ *F02B 37/24* (2013.01); *F02B 37/004* (2013.01); *F02B 37/013* (2013.01); *F02B 37/14* (2013.01);
(Continued)

(58) Field of Classification Search
CPC ...... F02B 37/24; F02B 37/004; F02B 37/013; F02B 37/14; F02B 39/10; G01R 19/165; Y02T 10/12
(Continued)

(56) References Cited

U.S. PATENT DOCUMENTS 6,211,283 B1  4/2001  Honda et al.
8,159,184 B2  4/2012  Emori et al.
(Continued)

FOREIGN PATENT DOCUMENTS

CN  103180582 A  6/2013
JP  6-280588 A  10/1994
(Continued)

OTHER PUBLICATIONS

Chinese Office Action and Search Report, dated Dec. 12, 2018, for Chinese Application No. 201580073602.2.
(Continued)

*Primary Examiner* — Thai Ba Trieu
(74) *Attorney, Agent, or Firm* — Birch, Stewart, Kolasch & Birch, LLP.

(57) ABSTRACT

A supercharging system includes: a first supercharger including a first compressor for compressing air to be supplied to an engine and a motor for driving the first compressor; a leakage current measuring part for measuring a leakage current of the motor; and a first controller for controlling the first supercharger. The first controller includes a motor control part configured to, when a measurement result by the leakage current measuring part is not less than a first threshold, set an upper limit value of an output command value for the motor to be lower than when the measurement result is less than the first threshold, and to control an output of the motor within a range which does not exceed the upper limit value.

6 Claims, 12 Drawing Sheets

(51) Int. Cl.
  *F02B 37/14* (2006.01)
  *F02B 37/00* (2006.01)
  *F02B 37/013* (2006.01)
  *G01R 19/165* (2006.01)
(52) U.S. Cl.
  CPC ............ *F02B 39/10* (2013.01); *G01R 19/165* (2013.01); *Y02T 10/12* (2013.01)
(58) Field of Classification Search
  USPC .......................................................... 60/608
  See application file for complete search history.

(56) References Cited

U.S. PATENT DOCUMENTS

| | | | |
|---|---|---|---|
| 9,225,207 B2 * | 12/2015 | Arita | ..................... F04D 25/06 |
| 9,744,962 B2 * | 8/2017 | Takahashi | ............. B60W 10/06 |
| 2007/0033938 A1 | 2/2007 | Ueno | |
| 2009/0195205 A1 | 8/2009 | Ide | |
| 2010/0134064 A1 | 6/2010 | Heikkila | |
| 2012/0217922 A1 | 8/2012 | Sato et al. | |
| 2014/0152224 A1 | 6/2014 | Enomoto et al. | |
| 2015/0194922 A1 | 7/2015 | Sato et al. | |
| 2017/0328272 A1 | 11/2017 | Yamashita et al. | |

FOREIGN PATENT DOCUMENTS

| | | |
|---|---|---|
| JP | 2000-298220 A | 10/2000 |
| JP | 2004-162648 A | 6/2004 |
| JP | 2005-137127 A | 5/2005 |
| JP | 2006-220124 A | 6/2006 |
| JP | 2008-75574 A | 4/2008 |
| JP | 4295753 B2 | 4/2009 |
| JP | 2012-173053 A | 9/2012 |
| JP | 2014-236571 A | 12/2014 |
| WO | WO 2013/018411 A1 | 2/2013 |

OTHER PUBLICATIONS

Extended European Search Report, dated Jun. 4, 2018, for European Application No. 15879991.6.
International Preliminary Report on Patentability and Written Opinion of the International Searching Authority (PCT/IB/373, PCT/ISA/237, PCT/IB338 and PCT/IB/326), dated Aug. 10, 2017, for International Application No. PCT/JP2015/052659, along with an English translation.
International Search Report (forms PCT/IBS/210 and PCT/ISA/220), dated Apr. 28, 2015, for International Application No. PCT/JP2015/052659, along with an English translation.
Office Action dated Jan. 5, 2018 issued to the corresponding JP Application No. 2016-571633 with a English Machine Translation.
Yamashita et al., "Development of Electric Supercharger to Facilitate the Downsizing of Automobile Engines," Mitsubishi Heavy Industries Technical Review, vol. 47, No. 4, Dec. 2010, pp. 7-17 (Total 12 pages), with an English translation.

* cited by examiner

SUPERCHARGING SYSTEM, CONTROL DEVICE FOR SUPERCHARGING SYSTEM, AND METHOD FOR OPERATING SUPERCHARGING SYSTEM

CROSS-REFERENCE TO RELATED APPLICATIONS

This application is a Divisional of copending application Ser. No. 15/532,601, filed on Jun. 2, 2017, which was filed as PCT International Application No. PCT/JP2015/052659 on Jan. 30, 2015, all of which are hereby expressly incorporated by reference into the present application.

TECHNICAL FIELD

The present disclosure relates to a supercharging system, a control device for the supercharging system, and a method for operating the supercharging system.

BACKGROUND ART

It is known that occurrence of insulation degradation of winding, which is a typical example of malfunction of a motor, causes an increase in a leakage electric current with development of the insulation degradation.

To detect such a leakage current, Patent Document 1 discloses an electric leakage detection system for detecting a presence or absence of electric leakage when an inverter motor is supplied with voltage, provided for a motor compressor system for air conditioning. In this electric leakage detection system, electric leakage is detected by an electric leakage detection sensor. If electric leakage is detected, power supply to the inverter motor is immediately stopped to stop operation of the inverter motor.

CITATION LIST

Patent Literature

Patent Document 1: JP2000-298220A

SUMMARY

Problems to be Solved

Meanwhile, known motored superchargers include, for instance, an electric supercharger equipped with a motor-driven compressor, and an electric-assisted turbocharger equipped with a compressor which is driven by engine exhaust and also assisted by a motor. For such a motored supercharger, stopping operation of the motor immediately upon detection of electric leakage as described above may lead to deterioration of drivability due to a rapid decrease in the engine output and the vehicle speed.

In view of the above, an object of at least one embodiment of the present invention is to provide a supercharging system whereby it is possible to mitigate deterioration of drivability due to malfunction of a motor.

Solution to the Problems (1) A supercharging system according to at least one embodiment of the present invention comprises: a first supercharger including a first compressor for compressing air to be supplied to an engine and a motor for driving the first compressor; a leakage current measuring part for measuring a leakage current of the motor; and a first controller for controlling the first supercharger. The first controller includes a motor control part configured to, if a measurement result by the leakage current measuring part is not less than a first threshold, set an upper limit value of an output command value for the motor to be lower than when the measurement result is less than the first threshold, and to control an output of the motor within a range which does not exceed the upper limit value.

If insulation degradation of winding occurs in a motor, leakage current increases with development of the insulation degradation.

With the above configuration (1), if the measurement result of the leakage current of the motor is not less than the first threshold, i.e., when the motor is malfunctioning or is about to malfunction, the upper limit value of the output command value for the motor is set to be lower than when it is otherwise, and the output of the motor is controlled in the range of the upper limit value. Thus, compared to a case in which the motor is stopped immediately after the motor is determined to be malfunctioning, the output of the motor is reduced gradually, which mitigates deterioration of drivability. Further, insulation degradation of the motor occurs depending on the temperature of the wire of the motor (motor winding or wire that leads to outside from the motor), and is more likely to develop when the temperature of the wire is higher. In this regard, with the above configuration (1), reducing the output of the motor as described above also reduces the wire temperature of the motor, and thereby it is possible to suppress development of insulation degradation of the motor.

(2) In some embodiments, in the above configuration (1), the motor control part is configured to: set, if the measurement result is not less than the first threshold and less than a second threshold which is greater than the first threshold, the upper limit value of the output command value for the motor to be greater than zero and smaller than when the measurement result is less than the first threshold; and set, if the measurement result is not less than the second threshold, the upper limit value of the output command value for the motor to zero. With the above configuration (2), the upper limit value of the output command value for the motor is reduced to a value larger than zero if the leakage current of the motor increases to at least the first threshold, and the upper limit value of the output command value for the motor is set to zero when the leakage current is at least the second threshold which is greater than the first threshold. Accordingly, the upper limit value of the output command value for the motor is reduced in stages with an increase in the leakage current of the motor. Thus, compared to a case in which the motor is stopped immediately after the motor is determined to be malfunctioning, the output of the motor is reduced gradually, which mitigates deterioration of drivability.

(3) In some embodiments, in the above configuration (1) or (2), the first supercharger further includes: a first turbine configured to be capable of being rotary driven by exhaust gas from the engine and by the motor; and a first nozzle vane configured to adjust a flow path area of the exhaust gas flowing into the first turbine. The first controller further includes a first vane control part for controlling an opening degree of the first nozzle vane on the basis of a measurement result of the leakage current measuring part. The first vane control part is configured to, if the measurement result by the leakage current measuring part is not less than the first threshold, control an opening degree of the first nozzle vane so as to reduce the flow path area compared to when the measurement result is less than the first threshold, in response to reduction of the upper limit value of the output command value for the motor by the motor control part.

With the above configuration (3), when the leakage current of the motor increases and the upper limit value of the output command value for the motor is reduced, the opening degree of the nozzle vane is reduced in response to a decrease in the output command value. That is, the opening degree of the nozzle vane is reduced to increase the boost pressure in response to a decrease in the boost pressure due to a decrease in the output command value for the motor, and thereby it is possible to ensure a boost pressure by the supercharging system while performing a control by the motor control part.

(4) In some embodiments, in the above configuration (3), the first vane control part is configured to determine a first target opening degree of the first nozzle vane on the basis of a difference between a boost pressure by the supercharging system and a target boost pressure, and to control the opening degree of the first nozzle vane to the first target opening degree.

With the above configuration (4), a feedback control is performed on the first nozzle vanes so as to achieve a target opening degree determined on the basis of a difference between the boost pressure by the supercharging system and the target boost pressure, and thereby it is possible to bring the boost pressure closer to the target boost pressure while performing a control by the motor control part.

(5) In some embodiments, in the above configuration (4), the first vane control part is configured to obtain a first corrected opening degree by correcting the first target opening degree, corresponding to a reduction amount of the output command value for the motor by the upper limit value, and to control the opening degree of the first nozzle vane to the first corrected opening degree.

With the above configuration (5), the target opening degree of the first nozzle vanes in the feedback control is corrected corresponding to the amount of reduction of the output command value for the motor by the upper limit value, and thus it is possible to bring the boost pressure closer to the target boost pressure quickly compared to a case in which the target opening degree is not corrected.

(6) In some embodiments, in any one of the above configurations (1) to (5), the supercharging system further comprises: a second supercharger including a second compressor for compressing air to be supplied to the engine, a second turbine configured to be rotary driven by exhaust gas from the engine to drive the second compressor, and a second nozzle vane configured to adjust a flow path area of the exhaust gas flowing into the second turbine; and a second controller for controlling the second supercharger. One of the first supercharger or the second supercharger is a low-pressure stage supercharger. The other one of the first supercharger or the second supercharger is a high-pressure stage supercharger configured to further compress air which is compressed by the compressor of the low-pressure stage supercharger and to supply the air to the engine. The second controller includes a second vane control part configured to, if the measurement result by the leakage current measuring part is not less than the first threshold, control an opening degree of the nozzle vane so as to reduce the flow path area compared to when the measurement result is less than the first threshold, in response to reduction of the upper limit value of the output command value for the motor by the motor control part.

With the above configuration (6), when the leakage current of the motor of the first supercharger increases and the upper limit value of the output command value of the motor is reduced, the opening degree of the nozzle vane of the second supercharger is reduced in response to a decrease in the output command value. That is, the pressure ratio of the second supercharger is increased in response to a decrease in the pressure ratio of the first supercharger, and thereby it is possible to ensure a boost pressure by the supercharging system while performing a control by the motor control part.

(7) In some embodiments, in the above configuration (6), the second vane control part is configured to determine a second target opening degree of the second nozzle vane on the basis of a difference between a boost pressure by the supercharging system and a target boost pressure, to control the opening degree of the second nozzle vane to the second target opening degree.

With the above configuration (7), a feedback control is performed on the second nozzle vanes so as to achieve a target opening degree determined on the basis of a difference between the boost pressure by the supercharging system and the target boost pressure, and thereby it is possible to bring the boost pressure closer to the target boost pressure while performing a control by the motor control part.

(8) In some embodiments, in the above configuration (7), the second vane control part is configured to obtain a second corrected opening degree by correcting the second target opening degree corresponding to a reduction amount of the output command value for the motor by the upper limit value, and to control the opening degree of the second nozzle vane to the second corrected opening degree.

With the above configuration (8), the target opening degree of the second nozzle vane in the feedback control is corrected corresponding to the amount of reduction of the output command value for the motor by the upper limit value, and thus it is possible to bring the boost pressure closer to the target boost pressure quickly compared to a case in which the target opening degree is not corrected.

(9) In some embodiments, in any one of the above configurations (1) to (8), the motor includes an inverter for converting a direct current voltage from a battery to a three-phase alternating current voltage and supplying the three-phase alternating current voltage to a motor winding. The leakage current measuring part includes an ammeter capable of collectively measuring a three-phase alternating current between the inverter and the motor.

With the above configuration (9), it is possible to measure a leakage current of the motor by measuring a zero-phase current of a three-phase alternating current between the inverter and the motor.

(10) In some embodiments, in any one of the above configurations (1) to (9), the motor includes an inverter for converting direct current voltage from a battery to three-phase alternating current voltage and supplying the three-phase alternating current voltage to a motor winding, and the leakage current measuring part includes an ammeter capable of collectively measuring going and returning direct current between the battery and the inverter.

With the above configuration (10), it is possible to measure a leakage current of the motor by measuring the total of going and returning direct current between the inverter and the motor.

(11) In some embodiments, in any one of the above configurations (1) to (10), the leakage current measuring part includes an insulation resistance meter capable of measuring an insulation resistance value of the motor.

With the above configuration (11), it is possible to detect a leakage current of the motor from a decrease in the insulation resistance value of the motor. Further, an insulation resistance value of the motor can be measured even when the motor is not supplied with power from the battery, and thus, a leakage current of the motor can be detected through the above configuration (11) even when the motor is not in operation.

(12) A control device according to at least one embodiment of the present invention is for the supercharging system having the configuration of any one of the above (1) to (11), and comprises a first controller which includes a motor control part configured to, if a measurement result by the leakage current measuring part is not less than a first threshold, set an upper limit value of an output command value for the motor to be lower than when the measurement result is less than the first threshold, to control an output of the motor within a range which does not exceed the upper limit value.

If insulation degradation of winding occurs in a motor, leakage current increases with development of the insulation degradation.

With the above configuration (12), if the measurement result of the leakage current of the motor is not less than the first threshold, i.e., when the motor is malfunctioning or is about to malfunction, the upper limit value of the output command value for the motor is set to be lower than when it is otherwise, and the output of the motor is controlled in the range of the upper limit value. Thus, compared to a case in which the motor is stopped immediately after the motor is determined to be malfunctioning, the output of the motor is reduced gradually, which mitigates deterioration of drivability. Further, insulation degradation of the motor occurs depending on the temperature of the wire of the motor (motor winding or wire that leads to outside from the motor), and is more likely to develop when the temperature of the wire is higher. In this regard, with the above configuration (12), reducing the output of the motor as described above also reduces the wire temperature of the motor, and thereby it is possible to suppress development of insulation degradation of the motor.

(13) A method of operating a supercharging system which comprises a first supercharger including a first compressor for compressing air to be supplied to an engine and a motor for driving the first compressor, according to at least one embodiment of the present invention, comprises: a leakage current measuring step of measuring a leakage current of the motor; an output upper-limit-value setting step of setting, if a measurement result in the leakage current measuring step is not less than a first threshold, set an upper limit value of an output command value for the motor to be lower than when the measurement result is less than the first threshold; and an output control step of controlling an output of the motor within a range which does not exceed the upper limit value set in the output upper-limit-value setting step.

If insulation degradation of winding occurs in a motor, leakage current increases with development of the insulation degradation.

According to the above method (13), if the measurement result of the leakage current of the motor is not less than the first threshold, i.e., when the motor is malfunctioning or is about to malfunction, the upper limit value of the output command value for the motor is set to be lower than when it is otherwise, and the output of the motor is controlled within the range of the upper limit value. Thus, compared to a case in which the motor is stopped immediately after the motor is determined to be malfunctioning, the output of the motor is reduced gradually, which mitigates deterioration of drivability. Further, insulation degradation of the motor occurs depending on the temperature of the wire of the motor (motor winding or wire that leads to outside from the motor), and is more likely to develop when the temperature of the wire is higher. In this regard, according to the above method (1), reducing the output of the motor as described above also reduces the wire temperature of the motor, and thereby it is possible to suppress development of insulation degradation of the motor.

Advantageous Effects

According to at least one embodiment of the present invention, provided is a supercharging system whereby it is possible to mitigate deterioration of drivability due to malfunction of a motor.

DETAILED DESCRIPTION

Figure 1:
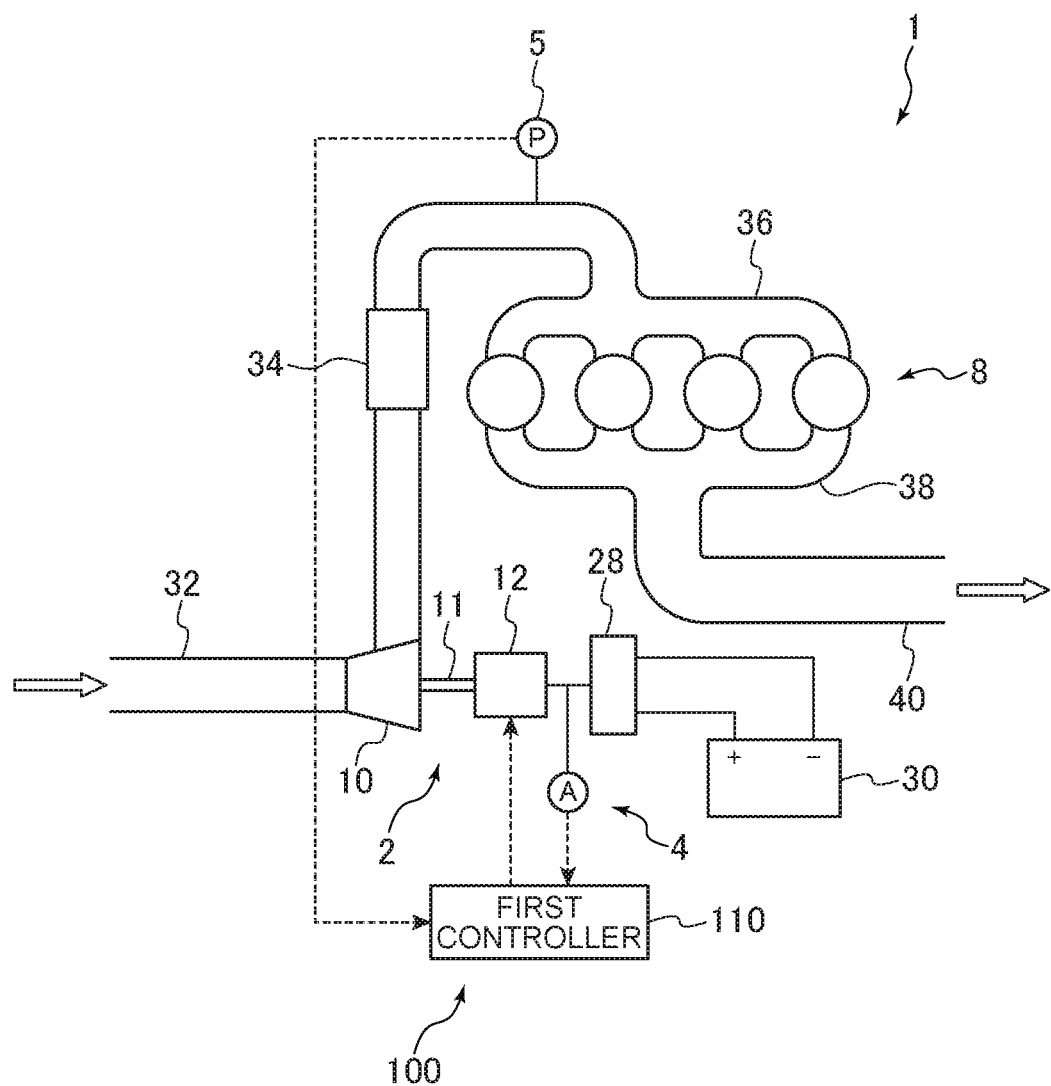
FIG. 1 is a configuration diagram of a supercharging system according to an embodiment.

Embodiments of the present invention will now be described in detail with reference to the accompanying drawings. It is intended, however, that unless particularly specified, dimensions, materials, shapes, relative positions and the like of components described in the embodiments shall be interpreted as illustrative only and not intended to limit the scope of the present invention.

FIGS. 1, 2, and 9 to 12 are each a configuration diagram of a supercharging system according to an embodiment. As depicted in FIGS. 1, 2, and 9 to 12, the supercharging system 1 includes a first supercharger 2 configured to compress a pressure of air to be supplied to an engine 8 mounted to a vehicle or the like, a leakage current measuring part 4, and a control device 100. The first supercharger 2 includes a first compressor 10 for compressing air to be supplied to the engine 8, and a motor 12 for driving the first compressor 10. The leakage current measuring part 4 is configured to measure a leakage current of the motor 12. Further, the control device 100 includes a first controller 110 for controlling the first supercharger 2.

Figure 9:
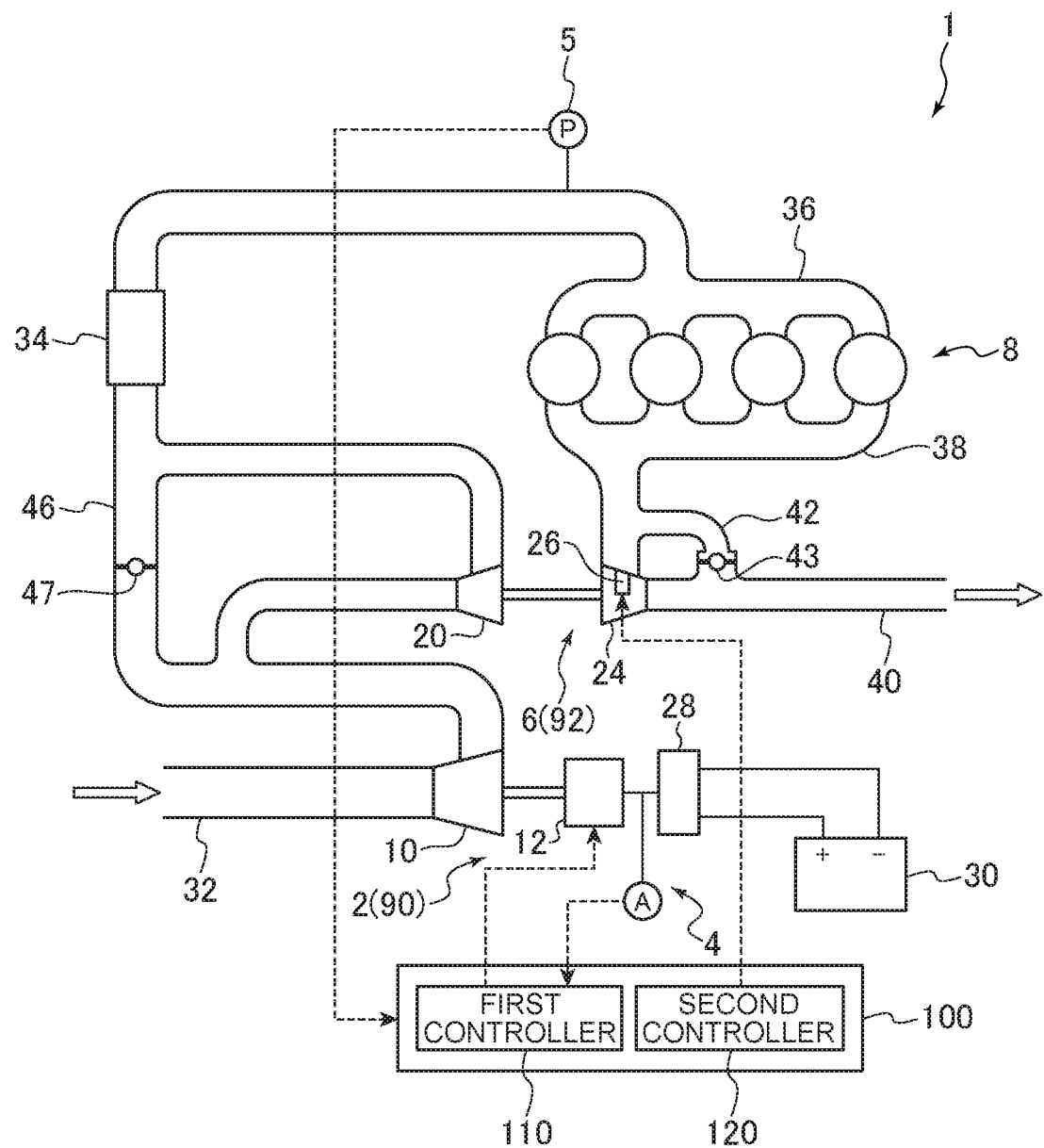
FIG. 9 is a configuration diagram of a supercharging system according to an embodiment.
Figure 10:
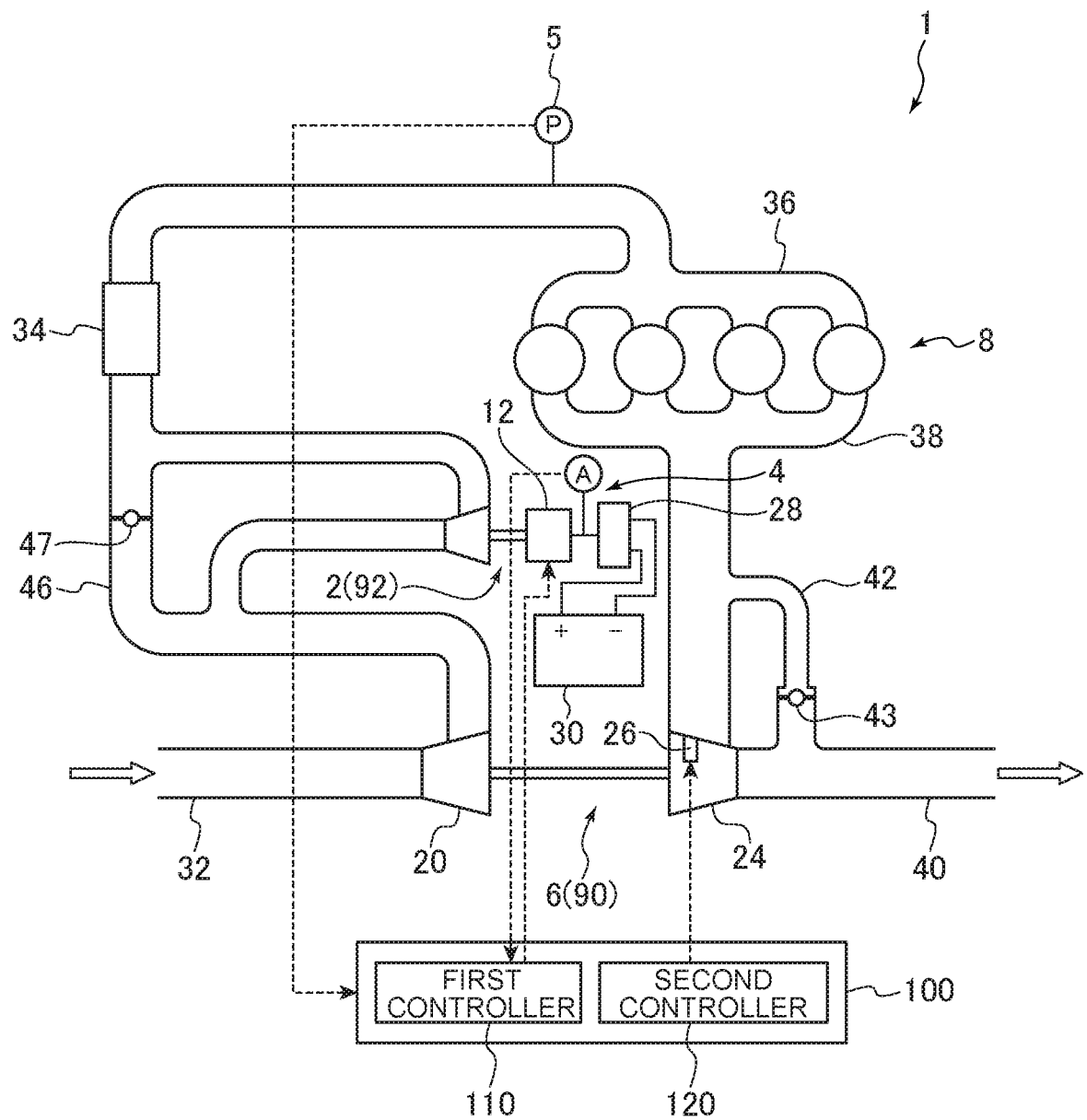
FIG. 10 is a configuration diagram of a supercharging system according to an embodiment.

The first supercharger 2 depicted in FIGS. 1, 9, and 10 is an electric supercharger in which the first compressor 10 is driven by the motor 12. The motor 12 includes an inverter 28 for converting direct-current voltage from a battery 30 into three-phase alternating current voltage and supplying the alternating current voltage to a motor winding. The motor 12 is configured to be supplied with electric power from the battery 30 via the inverter 28, and to generate rotational energy. The first compressor 10 is connected to the motor 12 via a rotational shaft 11, and is rotary driven as the rotational energy generated by the motor 12 rotates the rotational shaft 11, and thereby intake air flowing into the first compressor 10 is compressed.

Figure 2:
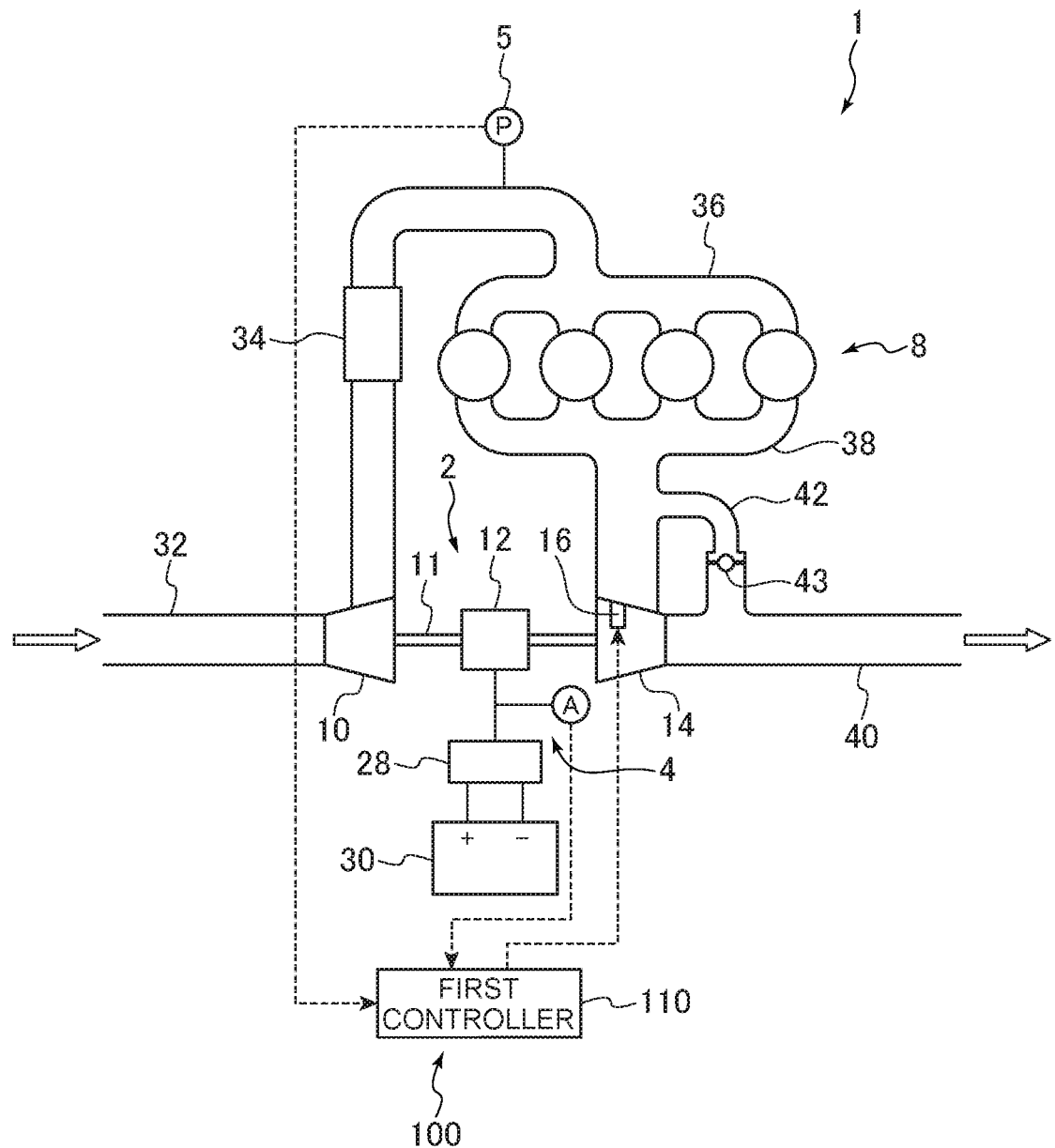
FIG. 2 is a configuration diagram of a supercharging system according to an embodiment.
Figure 11:
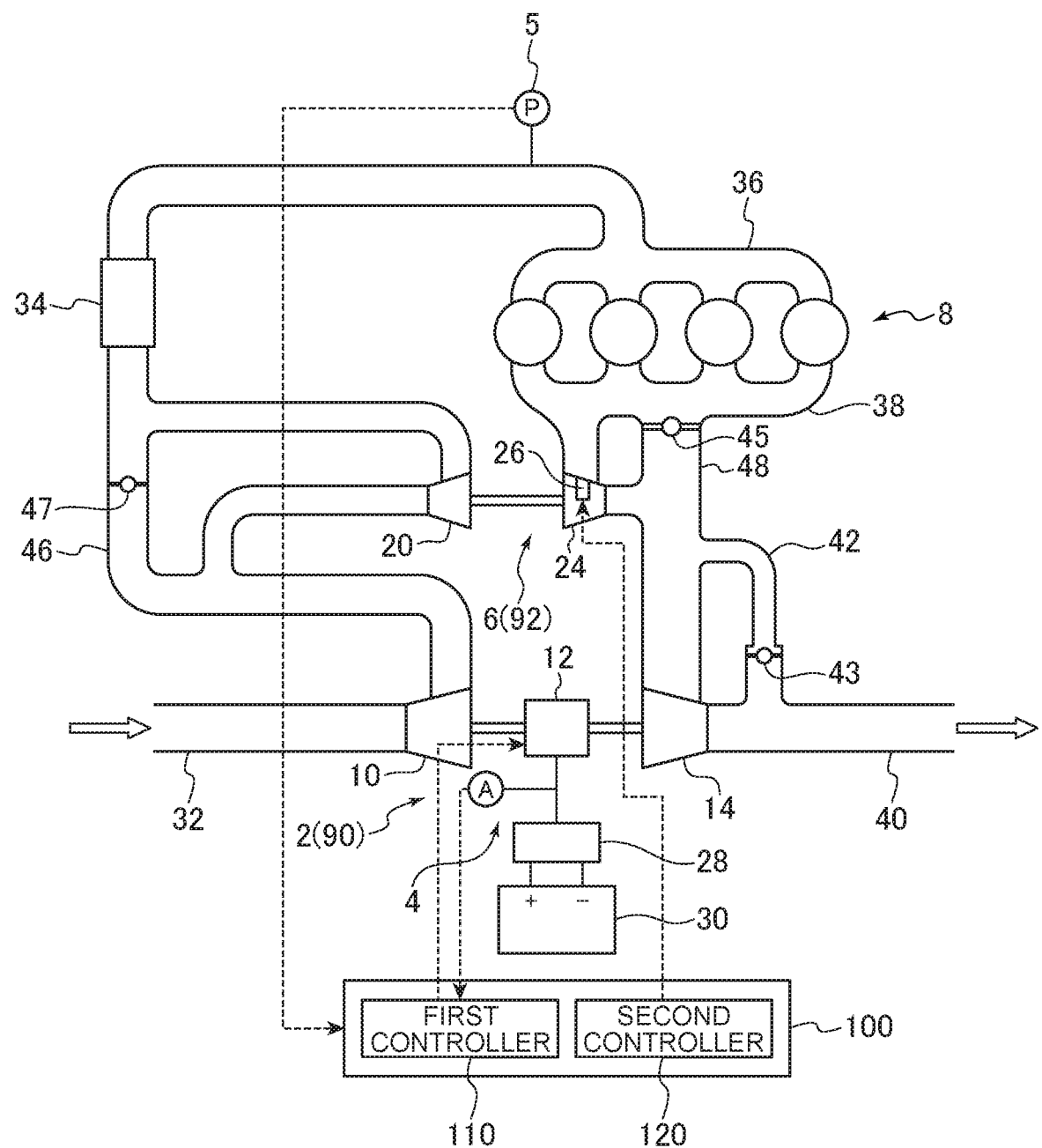
FIG. 11 is a configuration diagram of a supercharging system according to an embodiment.
Figure 12:
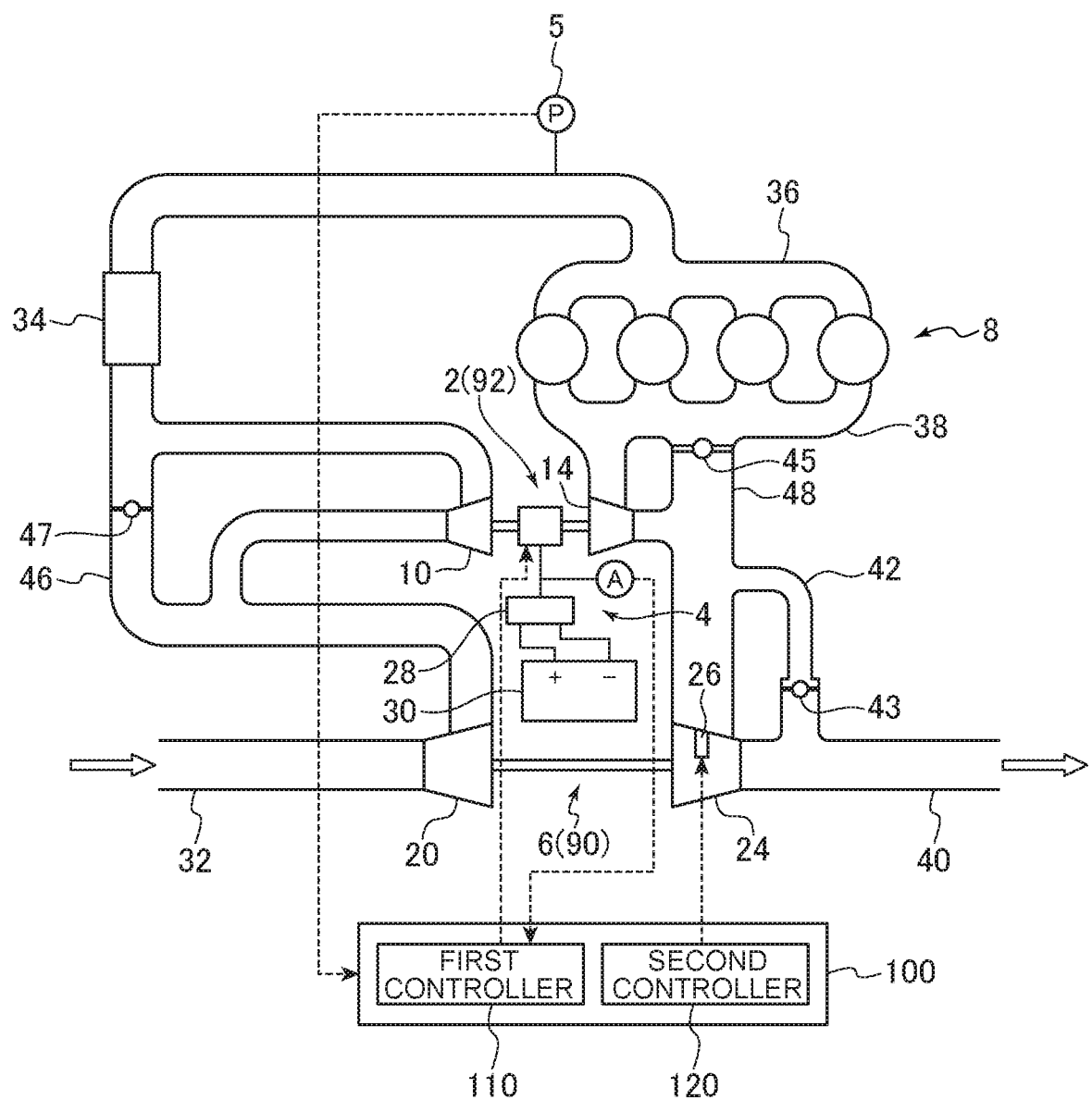
FIG. 12 is a configuration diagram of a supercharging system according to an embodiment.

The first supercharger 2 depicted in FIGS. 2, 11, and 12 is an electric-assist turbocharger further including a first turbine 14 which is rotary driven by exhaust gas from the engine 8, and the motor 12 assists the rotary driving of the first turbine 14 by exhaust gas. In other words, the first turbine can be rotary driven by exhaust gas from the engine 8 and by the motor 12. In the first supercharger 2, the first turbine 14 is connected to the first compressor 10 via the rotational shaft 11, and can rotate about the same axis with the first compressor 10. In the first supercharger, the first turbine 14 is rotary driven through inflow of exhaust gas from the engine 8, which causes the first compressor 10 to be coaxially driven via the rotational shaft 11, and thereby intake air flowing into the first compressor 10 is compressed.

In the first supercharger 2 depicted in FIGS. 2, 11, and 12, the motor 12 includes, similarly to the first supercharger 2 depicted in FIG. 1 and so on, the inverter 28 for converting direct-current voltage from the battery 30 into three-phase alternating current voltage and supplying the alternating current voltage to a motor winding. The motor 12 is configured to be supplied with electric power from the battery 30 via the inverter 28, and to generate rotational energy. Further, the motor 12 assists rotation of the rotational shaft 11 or rotary driving of the first compressor 10.

The first supercharger 2 depicted in FIG. 2 further includes a first nozzle vane 16 configured to adjust the flow-path area of exhaust gas from the engine 8 flowing into the first turbine 14.

Figure 3:
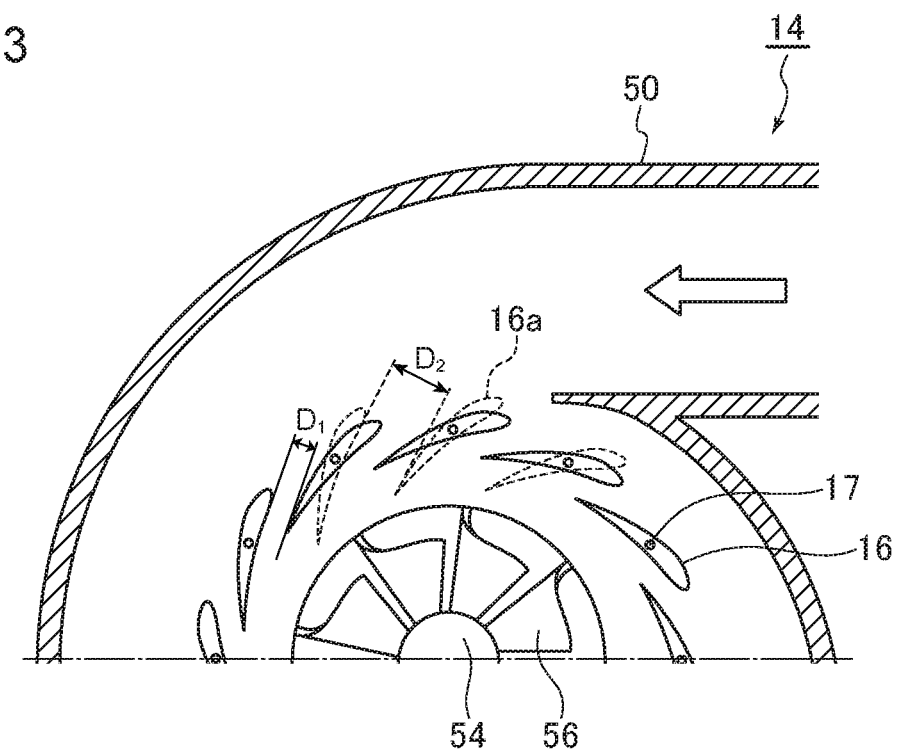
FIG. 3 is a schematic cross-sectional view of a turbine of a supercharger according to an embodiment.

With reference to FIG. 3, adjustment of the flow-path area of exhaust gas by the nozzle vane will be described. FIG. 3 is a schematic cross-sectional view of a turbine (herein, the first turbine 14) of a supercharger according to an embodiment. As depicted in FIG. 3, the first turbine 14 includes a turbine rotor 54 with a plurality of rotor blades 56 mounted thereto, inside a turbine casing 50. The turbine rotor 54 is connected to the first compressor 10 via the rotational shaft 11. As exhaust gas from the engine 8 flows into the first turbine 14, the rotor blades 56 receive a flow of exhaust gas and the turbine rotor 54 rotates, and thereby the first compressor 10 is rotary driven. A plurality of nozzle vanes 16 are disposed on the outer peripheral side of the turbine rotor 54, the nozzle vanes 16 being configured rotatable about support shafts 17 that serve as rotational shafts.

The opening degree of the plurality of nozzle vanes 16 can be changed by rotating the support shafts 17 with an actuator (not depicted). In FIG. 3, nozzle vanes 16a indicated by the dotted line have a larger opening degree than the nozzle vanes 16 indicated by the solid line. In other words, the distance D2 between the nozzle vanes 16a indicated by the dotted line is greater than the distance D1 between the nozzle vanes 16 indicated by the solid line. Thus, the flow-path area of exhaust gas is larger when the opening degree is large than when the opening degree is small.

With the opening degree of the nozzle vanes 16 reduced (i.e. the flow path area of exhaust gas is reduced), the inflow velocity of exhaust gas to the first turbine 14 increases, and thus it is possible to increase the boost pressure by the supercharging system 1. Furthermore, with the opening degree of the nozzle vanes 16 expanded (i.e. the flow path area of exhaust gas increased), the inflow velocity of exhaust gas to the first turbine 14 decreases, and thus it is possible to decrease the boost pressure by the supercharging system 1. Accordingly, it is possible to adjust the boost pressure by the supercharging system 1 by adjusting the opening degree of the nozzle vanes 16.

In the supercharging system 1 depicted in FIGS. 1, 2, and 9 to 12, air (intake air) introduced into the intake pipe 32 flows into the first compressor 10 of the first supercharger 2, and is compressed by rotation of the first compressor 10. The intake air compressed by the first compressor 10 is cooled by an intercooler 34, the amount of the intake air is adjusted by a throttle valve (not depicted), and the intake air is supplied to each cylinder of the engine 8 via an intake manifold 36. Compressed gas and fuel are supplied to each cylinder of the engine 8 to combust and generate exhaust gas, which is discharged to the exhaust pipe 40 via an exhaust manifold 38.

In the intake pipe 32, a pressure sensor 5 for measuring a pressure of air to be supplied to the engine 8 (boost pressure) may be disposed, on the further upstream side of the intake manifold 36.

In the supercharging system 1 depicted in FIG. 2, exhaust gas from the engine 8 flows into the first turbine 14 of the first supercharger 2, and exhaust gas having performed work in the first turbine 14 is discharged to the exhaust pipe 40.

A bypass pipe 42 bypassing the first turbine 14 may be connected to the exhaust pipe 40, and a waste-gate valve 43 may be disposed in the bypass pipe 42. By adjusting the opening degree of the waste-gate valve 43, it is possible to adjust the flow rate of exhaust gas that flows into the first turbine 14 and the flow rate of exhaust gas that flows through the bypass pipe 42, and thereby it is possible to control the rotation speed of the first turbine 14 and the rotation speed of the first compressor 10 coaxially driven with the first turbine 14. The opening degree of the waste-gate valve 43 may be controlled by the control device 100.

Figure 4:
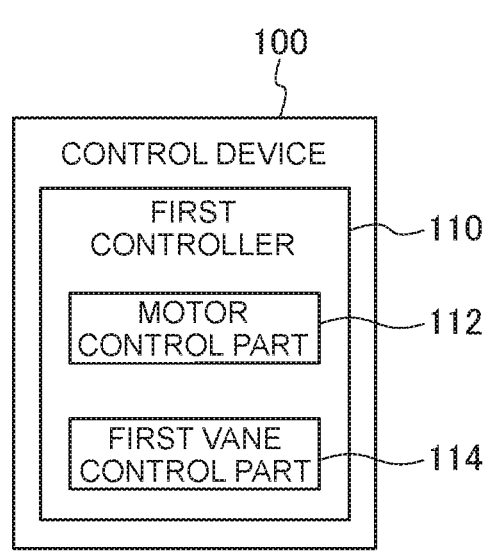
FIG. 4 is a configuration diagram of a control device for a supercharging system according to an embodiment.

FIG. 4 is a configuration diagram of a control device for a supercharging system according to an embodiment. As depicted in FIG. 4, the control device 100 for the supercharging system 1 according to an embodiment includes a first controller 110 for controlling the first supercharger 2. In an embodiment, the first controller 110 includes a motor control part 112 and a first vane control part 114.

The control device 100 may be an ECU for controlling the supercharging system 1. Further, the control device 100 may be an ECU provided independently from an engine ECU for controlling the engine 8.

The control device 100 may be a microcomputer comprising a central processing unit (CPU), a random access memory (RAM), a read only memory (ROM), and an I/O interface.

Figure 5:
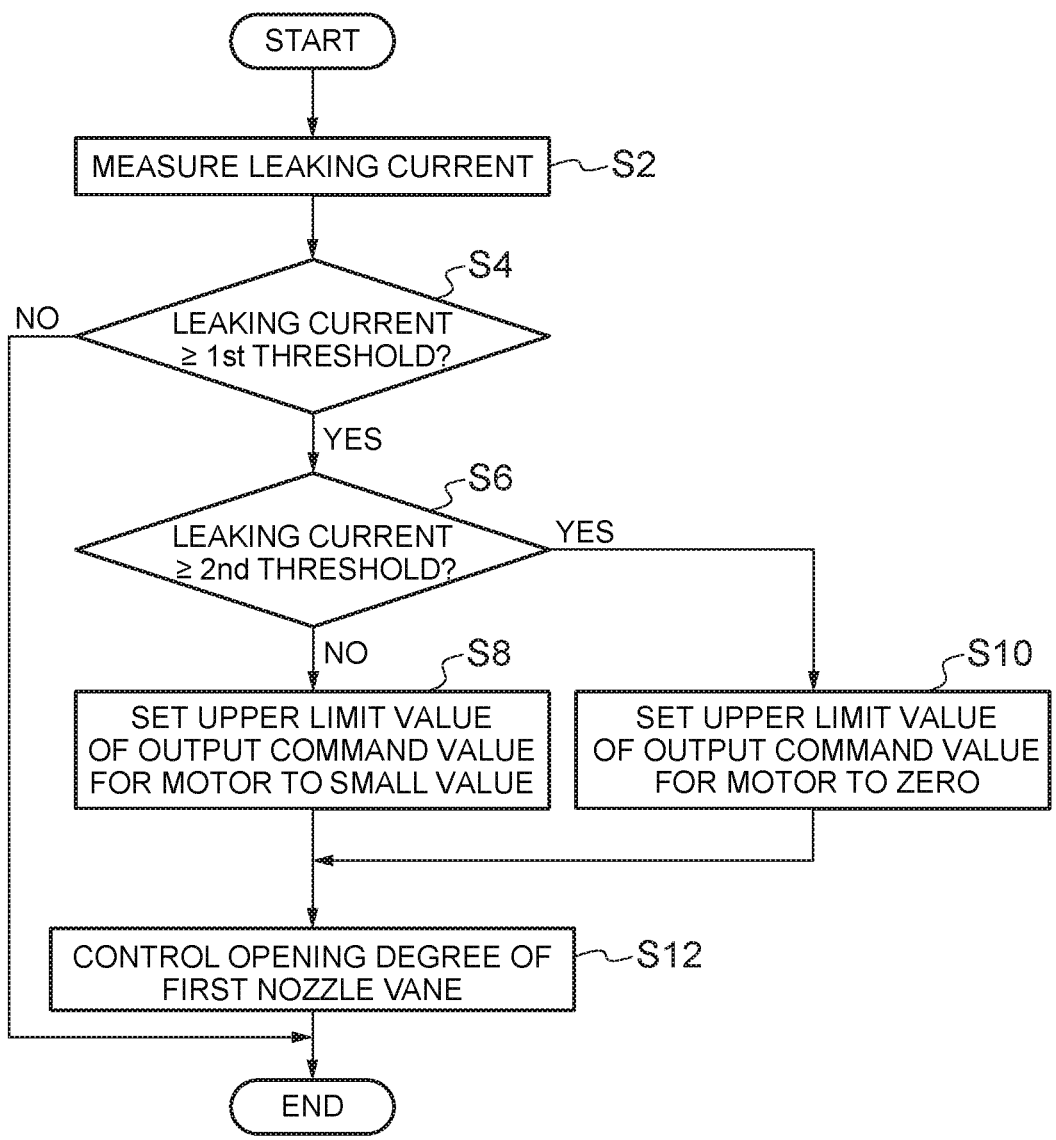
FIG. 5 is a flowchart of a method for operating a supercharging system according to an embodiment.

A method for operating the supercharging system 1 using the control device 100 according to an embodiment now will be described along the flowchart of FIG. 5. FIG. 5 is a flowchart of a method for operating a supercharging system according to an embodiment.

Leakage current of the motor 12 for driving the first compressor is measured (S2). Leakage current of the motor 12 is measured by using the leakage current measuring part 4 (described below).

If insulation degradation of winding, which is a typical example of malfunction of the motor 12, occurs in the motor 12, leakage current increases with development of the insulation degradation. In other words, a leakage current value indicates the stage of progress of malfunction of the motor 12.

A measurement value obtained by the leakage current measuring part 4 is sent to the first controller 110 as an electric signal.

Next, it is determined whether the measurement result of the leakage current of the motor 12 in S2 is greater than the first threshold set in advance (S4). The first controller 110 may include a storage part (memory), and the first threshold may be stored in the storage part in advance. Further, the first controller 110 may be configured to compare the first threshold stored in the storage part and a measurement value sent from the leakage current measuring part 4.

If it is determined in S4 that the measurement result of the leakage current of the motor 12 is less than the first threshold (No in S4), the flow is just ended. Alternatively, the flow may return to S2 and perform the step of measuring the leakage current.

If it is determined in S4 that the measurement result of the leakage current of the motor 12 is not less than the first threshold (YES in S4), the motor control part 112 sets an upper limit value of the output command value for the motor 12 to be lower than when the measurement result of the leakage current is less than the first threshold, and controls the output of the motor 12 to be within a range that does not exceed the upper limit value (S8 or S10).

As described above, if the measurement result of the leakage current of the motor 12 is not less than the first threshold, i.e., when the motor 12 is malfunctioning or is about to malfunction, the upper limit value of the output command value for the motor 12 is set to be lower than when it is otherwise, and the output of the motor 12 is controlled in the range of the upper limit value. Thus, compared to a case in which the motor 12 is stopped immediately after the motor 12 is determined to be malfunctioning, the output of the motor 12 is reduced gradually, which mitigates deterioration of drivability. Further, insulation degradation of the motor 12 occurs depending on the temperature of the wire of the motor 12 (motor winding or wire that leads to outside from the motor), and is more likely to develop when the temperature of the wire is higher. In this regard, reducing the output of the motor 12 as described above also reduces the wire temperature of the motor 12, and thereby it is possible to suppress development of insulation degradation of the motor 12.

To control the output of the motor 12, the motor control part 112 may control the voltage that the inverter 28 applies to the motor 12 so as to obtain a desired output from the motor 12.

As described above, if it is determined in S4 that the measurement result of the leakage current of the motor 12 is not less than the first threshold (Yes in S4), it may be further determined whether the measurement result of the leakage current exceeds a second threshold which is greater than the first threshold (S6). If it is determined in S6 that the measurement result of the leakage current of the motor 12 is less than the second threshold (No in S6), the motor control part 112 sets the upper limit value of the output command value for the motor 12 to be larger than zero and smaller than when the measurement result of the leakage current is less than the first threshold, and controls the output of the motor 12 to be within the range not exceeding the upper limit value (S8). If it is determined in S6 that the measurement result of the leakage current of the motor 12 is not less than the second threshold (Yes in S6), the motor control part 112 sets an upper limit value of the output command value for the motor 12 to zero, and controls the output of the motor 12 to become zero (S10).

In this case, the upper limit value of the output command value for the motor 12 is reduced in stages with an increase in the leakage current of the motor 12. Thus, compared to a case in which the motor 12 is stopped immediately after the motor 12 is determined to be malfunctioning, the output of the motor 12 is reduced gradually, which mitigates deterioration of drivability.

The second threshold may be stored in advance in the storage part of the first controller 110. Further, the first controller 110 may be configured to compare the second threshold stored in the storage part and a measurement value sent from the leakage current measuring part 4.

If the first supercharger 2 has the first turbine 14 and the first nozzle vanes 16 for adjusting the flow-path area of exhaust gas that flows from the engine 8 into the first turbine 14, the first vane control part 114 may control the opening degree of the first nozzle vanes 16 (S12) to ensure a boost pressure by the supercharging system 1. More specifically, when the measurement result by the leakage current measuring part 4 is not less than the first threshold (Yes in S4), the first vane control part 114 controls the opening degree of the first nozzle vanes 16 so that the flow path area of exhaust gas flowing into the first turbine 14 is smaller than when the measurement result of the leakage current is less than the first threshold, in response to reduction of the upper limit value of the output command value for the motor 12 by the motor control part 112 in S8 and S10.

Accordingly, the opening degree of the first nozzle vanes 16 is reduced to increase the boost pressure in response to a decrease in the boost pressure due to a decrease in the output command value for the motor 12, and thereby it is possible to ensure a boost pressure by the supercharging system 1 while performing a control by the motor control part 112.

Figure 6:
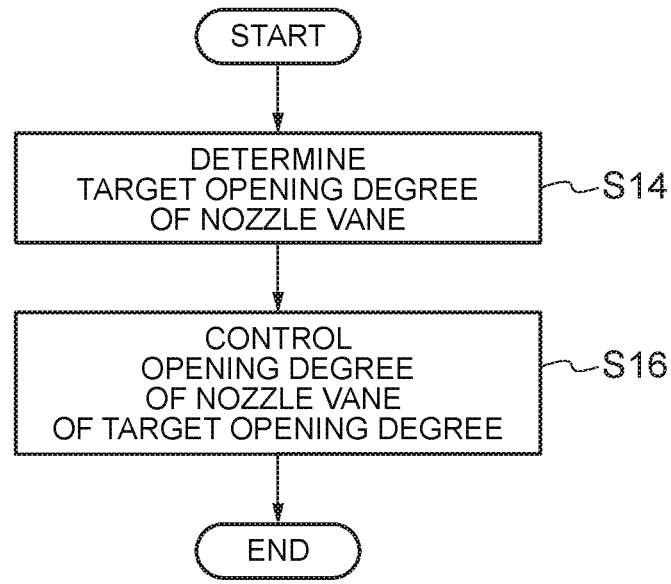
FIG. 6 is a flowchart of a nozzle-vane opening degree control according to an embodiment.
Figure 7:
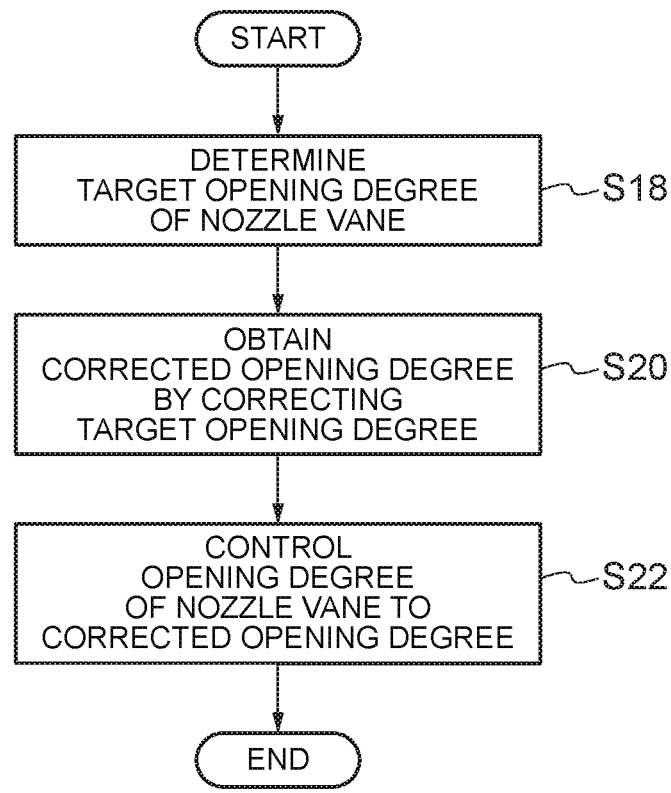
FIG. 7 is a flowchart of a nozzle-vane opening degree control according to an embodiment.

FIGS. 6 and 7 are each a flowchart of a step of controlling the opening degree of the first nozzle vanes (S12) according to an embodiment. In an embodiment, as depicted in FIG. 6, to control the first nozzle vanes 16, the first vane control part 114 determines the first target opening degree of the first nozzle vanes 16 on the basis of a difference between the boost pressure by the supercharging system 1 and the target boost pressure (S14), and controls the opening degree of the first nozzle vanes 16 to the first target opening degree (S16).

Accordingly, a feedback control (e.g. PI control or PID control) is performed on the first nozzle vanes 16 so as to achieve a target opening degree determined on the basis of a difference between the boost pressure by the supercharging system 1 and the target boost pressure, and thereby it is possible to bring the boost pressure closer to the target boost pressure while performing a control by the motor control part 112.

Further, the boost pressure by the supercharging system 1 may be measured by the pressure sensor 5 and sent to the first controller 110 as an electric signal.

In an embodiment, as depicted in FIG. 7, the first vane control part 114 determines the first target opening degree of the first nozzle vanes 16 on the basis of a difference between the boost pressure by the supercharging system 1 and the target boost pressure (S18), obtains the first corrected opening degree by correcting the first target opening degree of the first nozzle vanes 16 corresponding to the reduction amount of the output command value for the motor 12 by the upper limit value set in S8 or S10 (S20), and controls the opening degree of the first nozzle vanes 16 to the first corrected opening degree (S22).

Accordingly, the target opening degree of the first nozzle vanes 16 in the feedback control is corrected corresponding to the amount of reduction of the output command value for the motor 12 by the upper limit value, and thus it is possible to bring the boost pressure closer to the target boost pressure quickly compared to a case in which the target opening degree is not corrected.

Figure 8:
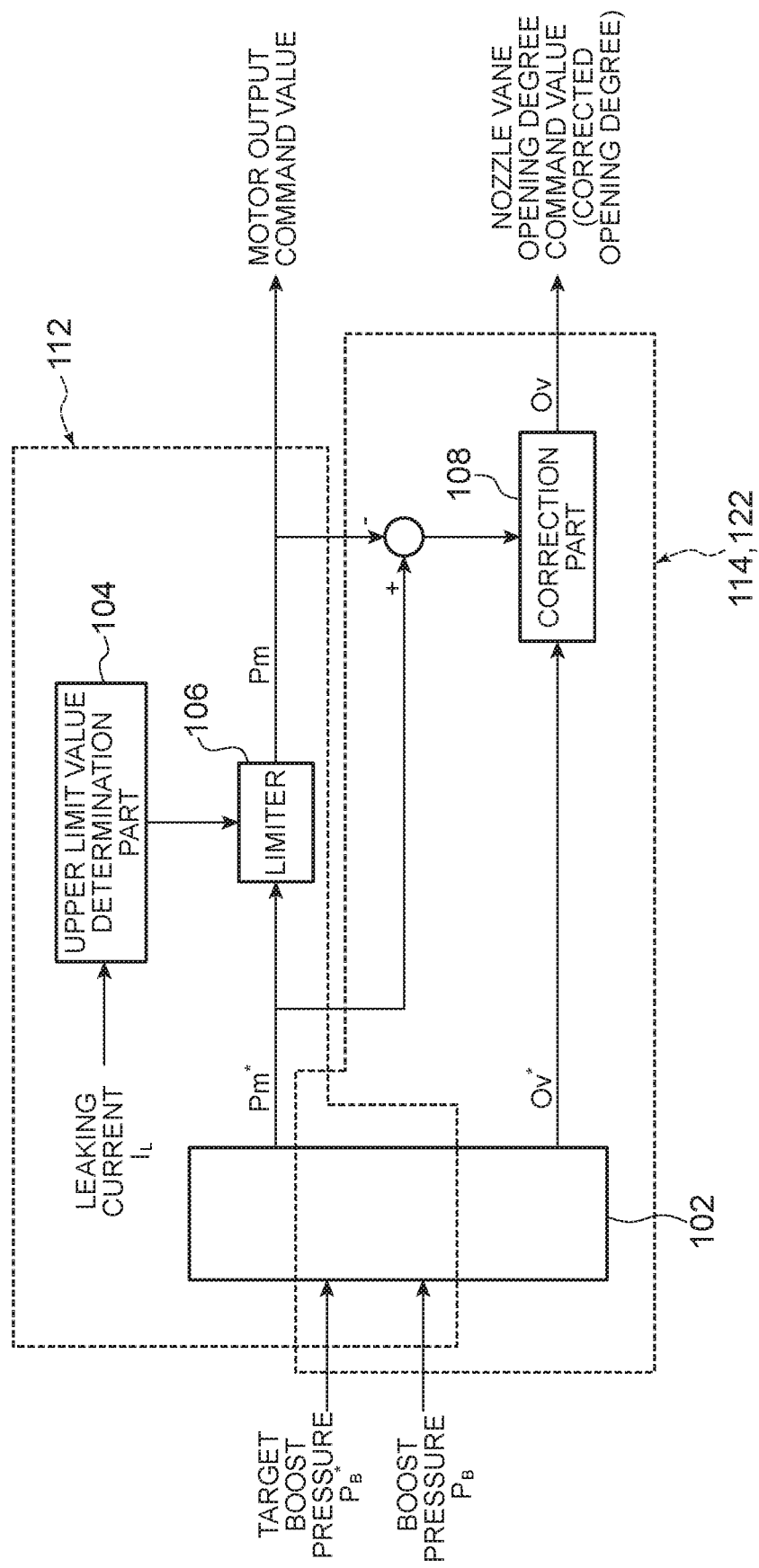
FIG. 8 is a control block diagram of a supercharging system according to an embodiment.

FIG. 8 is a control block diagram of a supercharging system according to an embodiment. The control block diagram shows the above described flow of control computation by the motor control part 112 and the first vane control part 114.

In the control block diagram depicted in FIG. 8, a command value calculation part 102 calculates a motor output command value $P_m^*$ and a nozzle vane opening degree command value (first target opening degree) $O_V^*$ for achieving a target boost pressure $P_B^*$ in the supercharging system 1, on the basis of the target boost pressure $P_B^*$ and an actual boost pressure $P_B$ by the supercharging system 1 measured by the pressure sensor 5. Calculation of the motor output command value $P_m^*$ and the nozzle vane opening degree command value (first target opening degree) $O_V^*$ may be performed taking account of vehicle velocity, engine rotation speed, accelerator step-in amount, for instance, in addition to the boost pressure $P_B$ and the target boost pressure $P_B^*$.

In the motor control part 112, an upper limit value determination part 104 determines the upper limit value of the output command value for the motor 12 on the basis of the value of a leakage current $I_L$ measured by the leakage current measuring part 4. For instance, if the measurement result by the leakage current measuring part 4 is not less than the above described first threshold, the upper limit of the output command value for the motor 12 is set to be lower than when the measurement result of the leakage current is less than the first threshold. Further, a limiter 106 imposes a limit on the motor output command value $P_m^*$ to be not greater than the set upper limit value of the output command value, and thereby $P_m$ is obtained. $P_m$ obtained as described above is used to control the output of the motor 12 as a motor output command value.

In the first vane control part 114, a correction part 108 corrects the first target opening degree $O_V^*$ of the first nozzle vane 16, and thereby the first corrected opening degree (the first nozzle vane opening degree command value) $O_V$ is obtained.

The correction part 108 corrects the first target opening degree of the first nozzle vanes 16 corresponding to a reduction amount of the output command value for the motor 12, that is, a difference between the target boost pressure $P_B^*$ calculated by the command value calculation part 102 and the motor output command value $P_m$ whose upper limit value is limited by the limiter 106, and thereby the first corrected opening degree (the first nozzle vane opening degree command value) $O_V$ is obtained. $O_V$ obtained as described above is used to control the opening degree of the first nozzle vanes 16 as the first corrected opening degree (the first nozzle vane opening degree command value).

The supercharging system 1 according to the embodiment depicted in FIGS. 9 to 12 further includes a second supercharger 6, and a second controller 120 for controlling the second supercharger 6.

The second supercharger 6 is a turbocharger including a second compressor 20 for compressing air to be supplied to the engine 8, and a second turbine 24 configured to be rotary driven by exhaust gas from the engine 8 to drive the second compressor 20. The second supercharger 6 includes a second nozzle vane 26 configured to adjust the flow-path area of exhaust gas flowing into the second turbine 24.

The first supercharger 2 and the second supercharger 6 are disposed in series in the supercharging system 1, and one of the first supercharger 2 or the second supercharger 6 is a low-pressure stage supercharger (90) that is disposed on the low pressure side (that is, a side closer to the inlet of intake air). The other one of the first supercharger 2 or the second supercharger 6 is a high-pressure stage supercharger (92) configured to further compress air that is compressed by the compressor (the first compressor 10 or the second compressor 20) of the low-pressure stage compressor (90) and to supply the air to the engine 8.

In the supercharging system 1 depicted in FIGS. 9 and 10, the first supercharger 2 is an electric supercharger in which the first compressor 10 is driven by the motor 12 as described above. In the supercharging system 1 depicted in FIG. 9, the first supercharger 2, which is an electric supercharger, is the low-pressure stage supercharger 90, and the second supercharger 6, which is a turbocharger having nozzle vanes, is the high-pressure stage supercharger 92. In the supercharging system 1 depicted in FIG. 10, the second supercharger 6, which is a turbocharger with nozzle vanes, is the low-pressure stage supercharger 90, and the first supercharger 2, which is an electric supercharger, is the high-pressure stage supercharger 92.

In the supercharging system 1 depicted in FIGS. 11 and 12, the second supercharger 6 is an electric-assist turbocharger including the first turbine 14 which is rotary driven by exhaust gas from the engine 8, and the rotary driving of the first turbine 14 by exhaust gas is assisted by the motor 12, as described above. In the supercharging system 1 depicted in FIG. 11, the first supercharger 2, which is an electric-assist turbocharger, is the low-pressure stage supercharger 90, and the second supercharger 6, which is a turbocharger with nozzle vanes, is the high-pressure stage supercharger 92. In the supercharging system 1 depicted in FIG. 10, the second supercharger 6, which is a turbocharger with nozzle vanes, is the low-pressure stage supercharger 90, and the first supercharger 2, which is an electric-assisted turbocharger, is the high-pressure stage supercharger 92.

The supercharging system 1 depicted in FIGS. 9 to 12 includes a recirculation passage 46 connecting the upstream side and the downstream side of the compressor (20 or 10) of the high-pressure stage supercharger 92 so as to bypass the compressor (20 or 10), disposed in the intake pipe 32 in which the compressor (10 or 20) of the low-pressure stage supercharger 90 and the compressor (20 or 10) of the high-pressure stage supercharger 92 are disposed, and a recirculation valve 47 disposed in the recirculation passage 46. To suppress surging in the supercharging system 1, a part of air introduced into the intake pipe 32 and compressed by the compressor (10 or 20) of the low-pressure stage supercharger 90 and the compressor (20 or 10) of the high-pressure stage supercharger 92 can be returned to the inlet of the compressor (20 or 10) of the high-pressure stage supercharger 92 through the recirculation passage 46 via the recirculation valve 47.

In the supercharging system 1 depicted in FIGS. 9 and 10, exhaust gas from the engine 8 flows into the second turbine 24 of the second supercharger 6, and exhaust gas having performed work in the second turbine 24 is discharged to the exhaust pipe 40.

A bypass pipe 42 bypassing the second turbine 24 may be connected to the exhaust pipe 40, and a waste-gate valve 43 may be disposed in the bypass pipe 42. By adjusting the opening degree of the waste-gate valve 43, it is possible to adjust the flow rate of exhaust gas that flows into the second turbine 24 and the flow rate of exhaust gas that flows through the bypass pipe 42, and thereby it is possible to control the rotation speed of the second turbine 24 and the rotation speed of the second compressor 20 coaxially driven with the second turbine 24. The opening degree of the waste-gate valve 43 may be controlled by the control device 100.

In the supercharging system 1 depicted in FIGS. 11 and 12, exhaust gas from the engine 8 flows into the turbine (24 or 14) of the high-pressure stage supercharger 92 and to the turbine (14 or 24) of the low-pressure stage supercharger 90 in this order, and exhaust gas having performed work in the turbine (14 or 24) of the low-pressure stage supercharger 90 is discharged to the exhaust pipe 40.

A bypass pipe 42 bypassing the turbine (14 or 24) of the low-pressure stage supercharger 90 may be connected to the exhaust pipe 40, and a waste-gate valve 43 may be disposed in the bypass pipe 42. By adjusting the opening degree of the waste-gate valve 43, it is possible to adjust the flow rate of exhaust gas that flows into the turbine (14 or 24) of the low-pressure stage supercharger 90 and the flow rate of exhaust gas that flows through the bypass pipe 42, and thereby it is possible to control the rotation speed of the turbine (14 or 24) of the low-pressure stage supercharger 90 and the rotation speed of the compressor (10 or 20) of the low-pressure stage supercharger 90 coaxially driven with the turbine (14 or 24). The opening degree of the waste-gate valve 43 may be controlled by the control device 100.

Further, a second bypass flow passage 48 is connected to the exhaust pipe 40 and the exhaust manifold 38 so as to bypass the turbine (24 or 14) of the high-pressure stage supercharger 92. A part of exhaust gas from the engine 8 can flow into the turbine (14 or 24) of the low-pressure stage supercharger 90 without passing through the turbine (24 or 14) of the high-pressure stage supercharger 92 via a bypass valve 45 disposed in the second bypass flow passage 48. By adjusting the opening degree of the bypass valve 45, it is possible to adjust the flow rate of exhaust gas that flows into the turbine (24 or 14) of the high-pressure stage supercharger 92 and the turbine (14 or 24) of the low-pressure stage supercharger 90, and thereby it is possible to control the rotation speed of the turbine (24 or 14) of the high-pressure stage supercharger 92 and the turbine (14 or 24) of the low-pressure stage supercharger 90, as well as the rotation speed of the compressor (20 or 10) of the high-pressure stage supercharger 92 and the compressor (10 or 20) of the low-pressure stage supercharger 90 coaxially driven with the turbine (24 or 14) and the turbine (14 or 24). The opening degree of the bypass valve 45 may be controlled by the control device 100.

Figure 13:
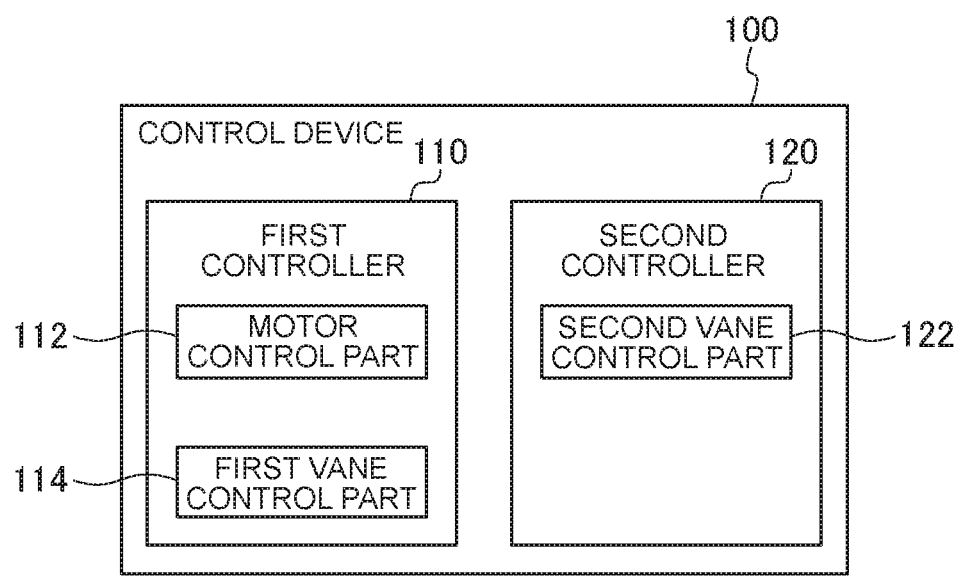
FIG. 13 is a configuration diagram of a control device for a supercharging system according to an embodiment.

FIG. 13 is a configuration diagram of a control device for a supercharging system according to an embodiment. As depicted in FIG. 13, the control device 100 used in the supercharging system 1 according to an embodiment includes a first controller 110 for controlling the first supercharger 2 and a second controller 120 for controlling the second supercharger 6. In an embodiment, the first controller 110 includes a motor control part 112 and a first vane control part 114, and the second controller 120 includes a second vane control part. Each of the first controller 110 and the second controller 120 may be a microcomputer comprising a central processing unit (CPU), a random access memory (RAM), a read only memory (ROM), and an I/O interface.

The supercharging system 1 depicted in FIGS. 9 to 12 can be controlled by using the control device 100 depicted in FIG. 13, for instance.

Figure 14:
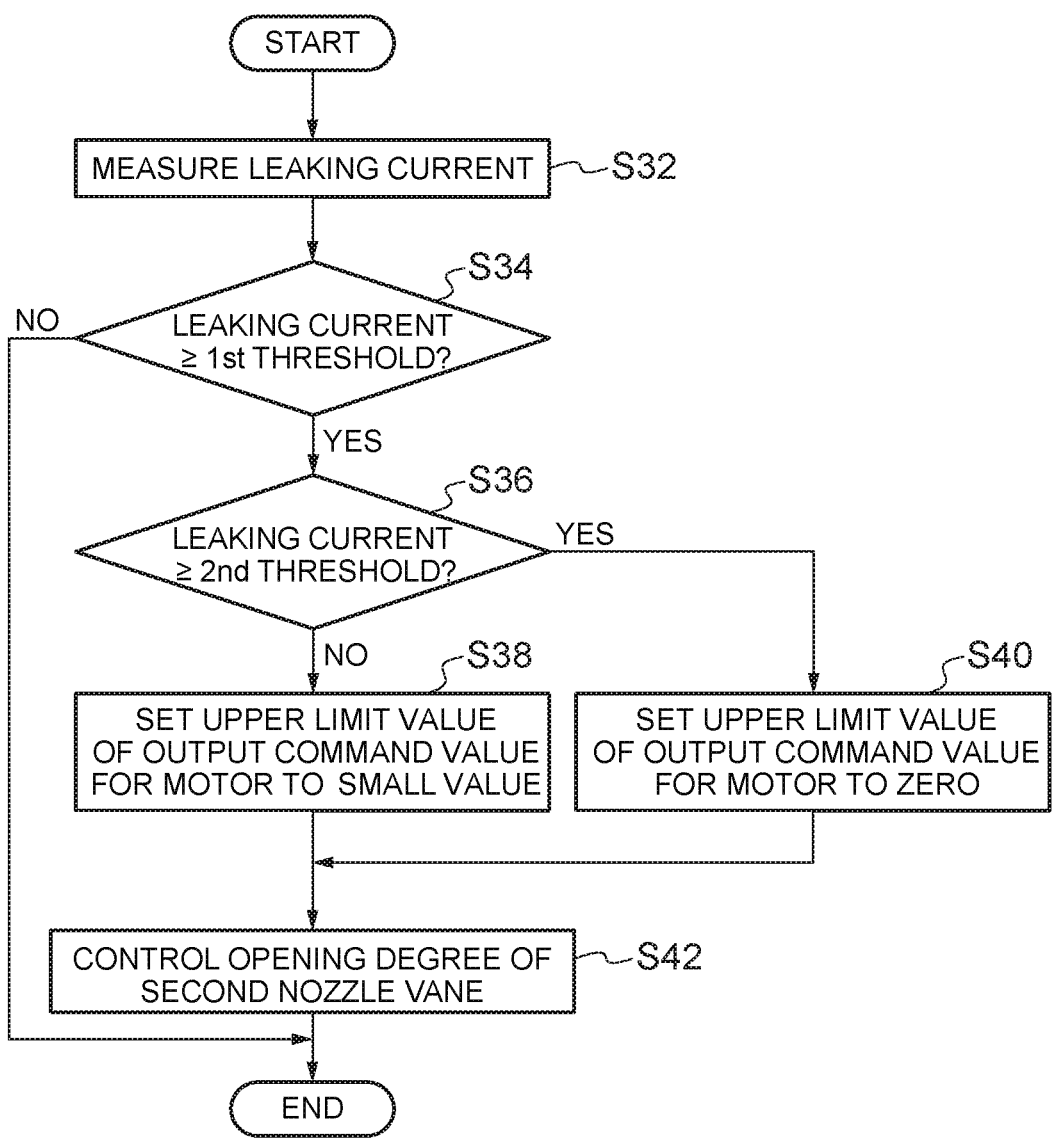
FIG. 14 is a flowchart of a method for operating a supercharging system according to an embodiment.

A method for operating the supercharging system 1 using the control device 100 including the first controller 110 and the second controller 120 will be described along the flowchart of FIG. 14. FIG. 14 is a flowchart of a method for operating a supercharging system according to an embodiment.

Herein, S32, S34, S36, S38, and S40 in FIG. 14 are the same as S2, S4, S6, S8, and S10 in the flowchart of FIG. 5, and thus not described in detail.

In S34, when it is determined that the measurement result of the leakage current of the motor 12 is not less than the first threshold (Yes in S34), the second vane control part 122 may control the opening degree of the second nozzle vanes 26 (S42) to ensure the boost pressure by the supercharging system 1. More specifically, when the measurement result by the leakage current measuring part 4 is not less than the first threshold (Yes in S34), the second vane control part 122 controls the opening degree of the second nozzle vanes 26 so that the flow path area of exhaust gas flowing into the second turbine 24 becomes smaller than when the measurement result of the leakage current is less than the first threshold, in response to reduction of the upper limit value of the output command value for the motor 12 by the motor control part 112 in S38 or S40.

Accordingly, the opening degree of the second nozzle vanes 26 is reduced to increase the boost pressure in response to a decrease in the boost pressure due to a decrease in the output command value for the motor 12, and thereby it is possible to ensure a boost pressure by the supercharging system 1 while performing a control by the motor control part 112.

The opening degree of the second nozzle vanes 26 in S42 can be controlled in accordance with the flowchart depicted in FIG. 6 or 7 described above, for instance.

That is, in an embodiment, as depicted in FIG. 6, to control the second nozzle vanes 26, the second vane control part 122 determines the second target opening degree of the second nozzle vanes 26 on the basis of a difference between the boost pressure by the supercharging system 1 and the target boost pressure (S14), and controls the opening degree of the second nozzle vanes 26 to the second target opening degree (S16).

Accordingly, a feedback control (e.g. PI control or PID control) is performed on the second nozzle vanes 26 so as to achieve a target opening degree determined on the basis of a difference between the boost pressure by the supercharging system 1 and the target boost pressure, and thereby it is possible to bring the boost pressure closer to the target boost pressure while performing a control by the motor control part 112.

Further, in an embodiment, as depicted in FIG. 7, the second vane control part 122 determines the second target opening degree of the second nozzle vanes 26 on the basis of a difference between the boost pressure by the supercharging system 1 and the target boost pressure (S18), obtains the second corrected opening degree by correcting the second target opening degree of the second nozzle vanes 26 corresponding to the reduction amount of the output command value for the motor 12 by the upper limit value set in S38 or S40 (S20), and controls the opening degree of the second nozzle vanes 26 to the second corrected opening degree (S22).

Accordingly, the target opening degree of the second nozzle vanes 26 in the feedback control is corrected corresponding to the amount of reduction of the output command value for the motor 12 by the upper limit value, and thus it is possible to bring the boost pressure closer to the target boost pressure quickly compared to a case in which the target opening degree is not corrected.

Next, the leakage current measuring part 4 according to some embodiments will be described.

In an embodiment, the leakage current measuring part 4 is an ammeter capable of collectively measuring a three phase alternating current between the motor 12 and the inverter 28 for converting direct-current voltage from the battery 30 into three-phase alternating current voltage and supplying the alternating current voltage to the motor winding. Such an ammeter includes, for instance, a clamp meter.

A clamp meter can be used, for instance, to measure a leakage current of the motor 12 by collectively measuring a zero-phase current of a three-phase alternating current between the inverter 28 and the motor 12. That is, if the total current obtained by collectively measuring a three-phase alternating current is zero, it means that there is no problem in insulation of the winding of the motor 12, and there is no occurrence of leakage current. In contrast, if the total current obtained by collectively measuring a three-phase alternating current is not zero, it means that there is occurrence of leakage current in the motor 12. If the total current is increasing, it means that insulation degradation of the winding is in progress.

In an embodiment, the leakage current measuring part 4 is an ammeter capable of collectively measuring going and returning direct current between the battery 30 and the inverter 28. Such an ammeter includes, for instance, a clamp meter.

A clamp meter can be used, for instance, to measure a leakage current of the motor 12 by collectively measuring the total of going and returning direct current between the battery 30 and the inverter 28. That is, if the total current obtained by collectively measuring going and returning direct current between the battery 30 and the inverter 28 is zero, it means that there is no problem in insulation of the winding of the motor 12, and there is no occurrence of leakage current. In contrast, if the total current obtained by collectively measuring going and returning direct current between the battery 30 and the inverter 28 is not zero, it means that there is occurrence of leakage current in the motor 12. If the total current is increasing, it means that insulation degradation of the winding is in progress.

In an embodiment the leakage current measuring part 4 is an insulation-resistance meter capable of measuring an insulation resistance value of the motor 12.

A decrease in the insulation resistance value of the motor 12 means an increase in leakage current of the motor 12. Thus, it is possible to detect a leakage current of the motor 12 with an insulation resistance meter for measuring an insulation resistance value of the motor 12. Further, an insulation resistance value of the motor 12 can be measured even when the motor 12 is not supplied with power from the battery 30, and thus, an insulation resistance meter can detect a leakage current of the motor 12 even when the motor 12 is not in operation.

The control device 100 may perform monitoring of leakage current by the leakage current measuring part 4. Further, monitoring of leakage current by the leakage current measuring part 4 may be performed not directly by the control device 100 but by an inverter controller, and may be sent to the control device 100 through communication (e.g. CAN).

As described above, before the motor 12 develops a critical insulation failure, an abnormality is detected from an increase in leakage current, which is a sign of malfunction of the motor 12, and the output of the motor 12 is controlled on the basis of the detection. Accordingly, it is possible to mitigate deterioration of drivability due to malfunction of the motor 12.

Embodiments of the present invention were described in detail above, but the present invention is not limited thereto, and various amendments and modifications may be implemented.

Further, in the present specification, an expression of relative or absolute arrangement such as "in a direction", "along a direction", "parallel", "orthogonal", "centered", "concentric" and "coaxial" shall not be construed as indicating only the arrangement in a strict literal sense, but also includes a state where the arrangement is relatively displaced by a tolerance, or by an angle or a distance whereby it is possible to achieve the same function.

For instance, an expression of an equal state such as "same" "equal" and "uniform" shall not be construed as indicating only the state in which the feature is strictly equal, but also includes a state in which there is a tolerance or a difference that can still achieve the same function.

On the other hand, an expression such as "comprise", "include", "have", "contain" and "constitute" are not intended to be exclusive of other components.

DESCRIPTION OF REFERENCE NUMERALS

1 Supercharging system
2 First supercharger
4 Leakage current measuring part
5 Pressure sensor
6 Second supercharger
8 Engine
10 First compressor
11 Rotational shaft
12 Motor
14 First turbine
16 First nozzle vane
17 Support shaft
20 Second compressor
24 Second turbine
26 Second nozzle vane
28 Inverter
30 Battery
32 Intake pipe
34 Intercooler
36 Intake manifold
38 Exhaust manifold
40 Exhaust pipe
42 Bypass pipe
43 Waste-gate valve
45 Bypass valve
46 Recirculation passage
47 Recirculation valve
48 Second bypass flow passage
50 Turbine casing
54 Turbine rotor
56 Rotor blade
90 Low-pressure stage supercharger
92 High-pressure stage supercharger
100 Control device 102 Command value calculation part
104 Upper limit value determination part
106 Limiter
108 Correction part
110 First controller
112 Motor control part
114 First vane control part
120 Second controller
122 Second vane control part

The invention claimed is:

1. A supercharging system, comprising:
   a supercharger including,
      a compressor for compressing air to be supplied to an engine,
      a motor for driving the compressor,
      a turbine driven by exhaust gas from the engine and by the motor, and
      a nozzle vane configured to adjust a flow path area of the exhaust gas flowing into the turbine;
   a leakage sensor measuring a leakage current of the motor; and
   a controller and a non-transitory memory storing executable instructions that cause the controller to:
      if a measurement result by the leakage current measuring part is not less than a threshold, set an upper limit value of an output command value for the motor to be lower than when the measurement result is less than the threshold;
      control an output of the motor within a range which does not exceed the upper limit value;
   determine a target opening degree of the nozzle vane on the basis of a difference between a boost pressure by the supercharging system and a target boost pressure; and
   obtain a corrected opening degree of the nozzle by correcting the target opening degree to reduce the flow path area, corresponding to a reduction amount of the output command value for the motor by the upper limit value; and
   control an opening degree of the nozzle vane to the corrected opening degree.

2. The supercharging system according to claim 1,
   wherein the executable instructions further causes the controller to:
      set, if the measurement result is not less than the threshold and less than another threshold which is greater than the threshold, the upper limit value of the output command value for the motor to be greater than zero and smaller than when the measurement result is less than the threshold; and
      set, if the measurement result is not less than the another threshold, the upper limit value of the output command value for the motor to zero.

3. The supercharging system according to claim 1,
   wherein the motor includes an inverter for converting a direct current voltage from a battery to a three-phase alternating current voltage and supplying the three-phase alternating current voltage to the motor, and
   wherein the leakage current sensor is an ammeter collectively measuring a three-phase alternating current between the inverter and the motor.

4. The supercharging system according to claim 1,
   wherein the motor includes an inverter for converting direct current voltage from a battery to three-phase alternating current voltage and supplying the three-phase alternating current voltage to the motor, and
   wherein the leakage current sensor is an ammeter collectively measuring going and returning direct current between the battery and the inverter.

5. The supercharging system according to claim 1,
   wherein the leakage current sensor is an insulation resistance meter measuring an insulation resistance value of the motor.

6. A method of operating a supercharging system which comprises a supercharger including, a compressor for compressing air to be supplied to an engine, a motor for driving the compressor, a turbine driven by exhaust gas from the engine and by the motor, and a nozzle vane configured to adjust a flow path area of the exhaust gas flowing into the first turbine, the method comprising:
   measuring a leakage current of the motor by a leakage sensor;
   by a controller,
      setting, if a measurement result in the leakage current measuring step is not less than a first threshold, an upper limit value of an output command value for the motor to be lower than when the measurement result is less than the first threshold;
      controlling an output of the motor within a range which does not exceed the upper limit value having been set;
      controlling an opening degree of the nozzle vane on the basis of the measured on the leakage current;
      determining a target opening degree of the nozzle vane on the basis of a difference between a boost pressure, detected by a pressure sensor of the supercharging system and a target boost pressure; and
      obtaining a corrected opening degree by correcting the target opening degree as to reduce the flow path area, corresponding to a reduction amount of the output command value for the motor by the upper limit value; and
      controlling the opening degree of the nozzle vane to the corrected opening degree.

* * * * *